(12) United States Patent
Ushiki et al.

(10) Patent No.: US 6,193,130 B1
(45) Date of Patent: Feb. 27, 2001

(54) BUMP BONDING APPARATUS

(75) Inventors: Hiroshi Ushiki, Iruma; Hirofumi Moroe; Koichi Takahashi, both of Musashimurayama, all of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/249,355

(22) Filed: Feb. 12, 1999

(30) Foreign Application Priority Data

Feb. 12, 1998 (JP) .................................................. 10-044199

(51) Int. Cl.⁷ .............................. B23K 1/00; B23K 5/00; B23K 37/00; B23K 31/00; B23K 31/02
(52) U.S. Cl. ........................... 228/6.2; 228/4.5; 228/102; 228/179.1
(58) Field of Search ............................. 228/102, 4.5, 6.2, 228/179.1

(56) References Cited

U.S. PATENT DOCUMENTS

| | | | |
|---|---|---|---|
| 4,768,070 | * 8/1988 | Takizawa et al. | 372/31 |
| 5,294,038 | * 3/1994 | Nakano | 228/179.1 |
| 5,579,985 | * 12/1996 | Ichikawa | 228/102 |
| 5,699,951 | * 12/1997 | Miyoshi | 228/4.5 |
| 5,979,739 | * 11/1999 | Jin et al. | 228/6.2 |
| 5,987,722 | * 11/1999 | Park et al. | 29/25.014 |

FOREIGN PATENT DOCUMENTS

| | | |
|---|---|---|
| 2-273945 | 11/1990 | (JP) . |
| 4-41519 | 7/1992 | (JP) . |
| 7-86286 | 3/1995 | (JP) . |

* cited by examiner

*Primary Examiner*—Patrick Ryan
*Assistant Examiner*—Zidia T. Pittman
(74) *Attorney, Agent, or Firm*—Koda & Androlia (57) ABSTRACT

A bump bonding apparatus comprising: a loader section that holds trays which accommodate semiconductor pellets and an unloader section that holds trays which accommodate semiconductor pellets to which bumps have been applied, the loader and unloader sections being provided next to each other on one side of a bonding stage; a buffer station and a supply and holding station provided so as to positionally correspond to the loader section and unloader section, respectively; a first pusher for sending trays from the loader section to the buffer station, a second pusher for sending trays from the supply and holding station to the unloader section, a third pusher for sending trays from the buffer station to the supply and holding station, and a pellet transfer mechanism for picking up a semiconductor pellet in the tray in the supply and holding station, transferring it to the bonding stages and then returning the semiconductor pellets to which bumps have been applied on the bonding stages back to the tray in which the semiconductor pellet has been accommodated.

6 Claims, 6 Drawing Sheets

BUMP BONDING APPARATUS

BACKGROUND OF THE INVENTION

1. Field of the Invention

The present invention relates to a bump bonding apparatus for forming bumps on semiconductor pellets.

2. Prior Art

In a bump bonding apparatus, for instance, as disclosed in Japanese Patent Application Laid-Open (Kokai) Nos. H2-273945 and H7-86286 and also in Japanese Patent Application Publication (Kokoku) No. H4-41519, after a ball is formed on the tip of a bonding wire (merely called "wire"), the wire is pressed against the electrode of a semiconductor pellet and then cut from the root portion of the ball, thus forming a bump on the electrode of the semiconductor pellet.

A conventional bump bonding apparatus as described above has a loader section and an unloader section provided one on each side of a bonding stage. A tray which accommodates therein semiconductor pellets is sent from the loader section to the front of the bonding stage, a semiconductor pellet is then picked up from the tray by a pick-up means, placed on a positioning stage and then positioned by a positioning means. After this, the semiconductor pellet is picked up by the pick-up means, placed on the bonding stage, and a bump is applied. The semiconductor pellet that has a bump thus made is then picked up by the pick-up means and returned to where it was originally accommodated in the tray.

This operation is repeated until bumps are applied to all of the semiconductor pellets in the tray, upon which the tray is moved to the unloader section.

In the above prior art, the loader section and unloader section are provided one on each side of the bonding stage. Accordingly, when, for example, a bump shaping stage that shapes up the bumps of the semiconductor pellets to which bumps have been applied is installed, or when an inspection stage that inspects the semiconductor pellets to which bumps have been applied is installed, these stages need to be installed between the bonding stage and the unloader section. However, this arrangement makes the bonding apparatus large in size. On the other hand, the apparatus becomes more expensive if an inspection apparatus having the above-described inspection stage is installed separately.

SUMMARY OF THE INVENTION

Accordingly, the object of the present invention is to provide a bump bonding apparatus that can be built compact compared to prior art apparatuses.

The above object is accomplished by a unique structure for a bump bonding apparatus which applies bumps to a semiconductor pellet placed on a bonding stage, and in the present invention, the bump bonding apparatus includes:

- a loader section that holds trays which accommodate therein semiconductor pellets, and an unloader section that holds trays which accommodate therein semiconductor pellets to which bumps have been applied, the loader and unloader sections being installed next to each other on one side of the bonding stage;
- a buffer station and a supply and holding station which are installed so as to positionally correspond to the loader section and unloader section, respectively;
- a pushing means for sending a tray from the loader section to the buffer station;
- a pushing means for sending a tray from the supply and holding station to the unloader section;
- a pushing means for sending a tray from the buffer station to the supply and holding station; and
- a pellet transfer mechanism for picking up a semiconductor pellet in the tray on the supply and holding station, transferring the pellet to the bonding stage, and returning the pellet to which bumps have been applied to the tray in which the semiconductor pellet was accommodated before.

In the above structure, a plurality of bonding stages can be provided next to each other so that each one of the bonding stages is moved independently to a pellet supply and take-out position and to a bonding position.

In addition, the pellet transfer mechanism has two suction nozzles provided so as to be selectively moved up and down, the suction component of one of the suction nozzles is formed in a trapezoidal shape, and the suction component of the other suction nozzle is formed flat Furthermore, a bump shaping stage for shaping the bumps of a semiconductor pellet and an inspection stage for inspecting the semiconductor pellet that has the bump which is shaped on the bump shaping stage are also provided.

In addition, the bump shaping stage and the inspection stage are provided on the opposite side from where the loader section and the unloader section are provided.

Furthermore, a positioning claw for positioning the semiconductor pellets placed on the bonding stage is provided on a bonding head or on an XY table on which the bonding head is mounted.

BRIEF DESCRIPTION OF THE DRAWINGS

FIG. 5 illustrates the movements of the trays seen from the above, in which FIG. 6 illustrates the pellet transfer mechanisms, in which

DETAILED DESCRIPTION OF THE INVENTION

One embodiment of the present invention will be described with reference to FIGS. 1 to 6.

Figure 1:
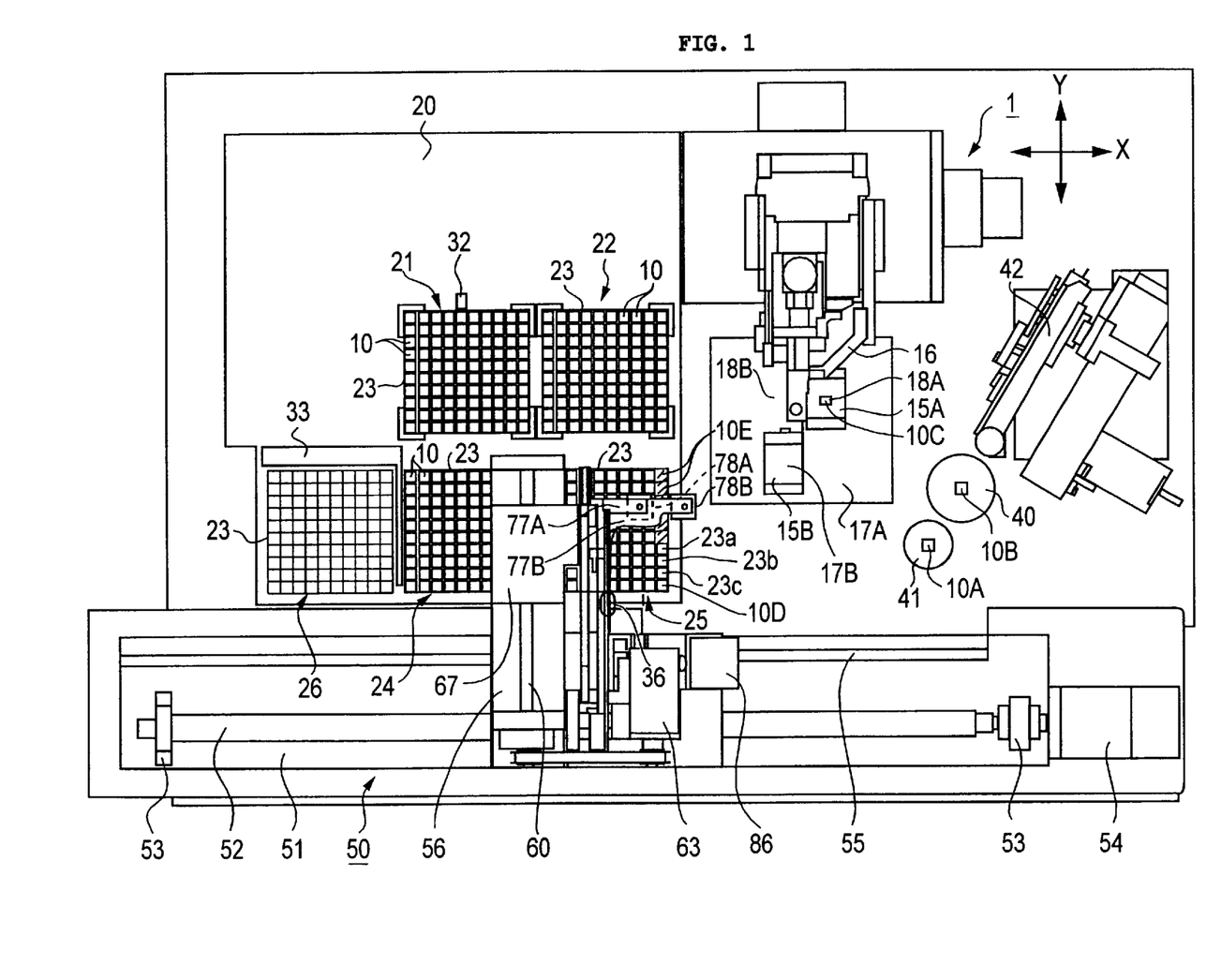
FIG. 1 is a top view of one embodiment of the bump bonding apparatus according to the present invention.
Figure 2:
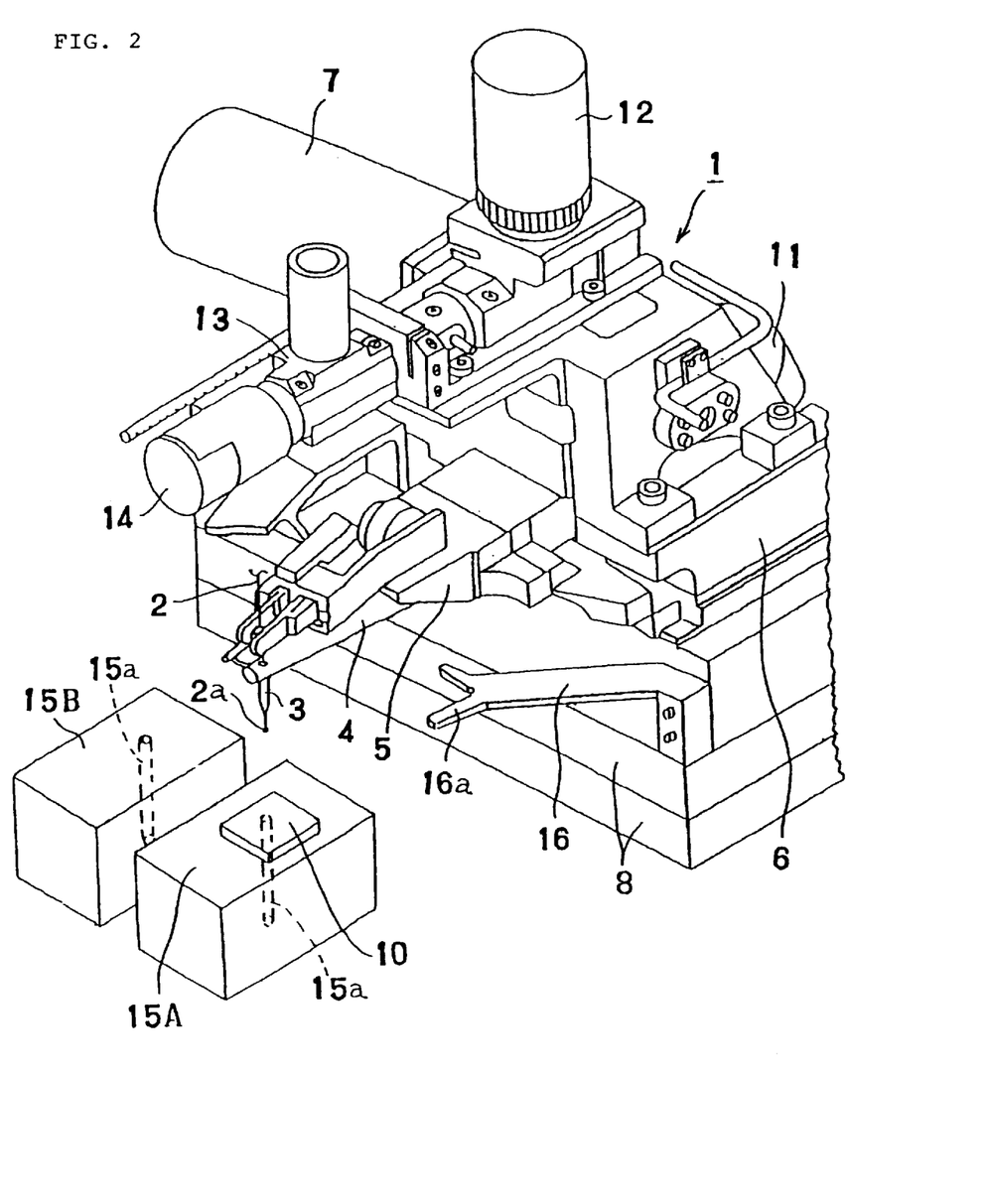
FIG. 2 is a perspective view thereof.

As seen from FIGS. 1 and 2, a capillary 3 into which a wire 2 is introduced so as to pass through is attached to one end of a bonding horn 4, and the bonding horn 4 is mounted on a lifter arm 5. The lifter arm 5 is swingably or vertically movably mounted on a bonding head 6 and is swung or vertically moved by a Z axis motor 7 installed in the bonding head 6. The bonding head 6 is mounted on an XY table 8.

The reference numeral 11 is a bonding load linear motor. The bonding load linear motor 11 imparts a bonding load for pressing a ball 2a formed on the distal end of the wire 2 against the electrode of a semiconductor pellet 10. The coil side of the bonding load linear motor 11 is fixed to the lifter arm 5, and the magnet side of the bonding load linear motor 11 is fixed to the bottom of the bonding head 6.

A camera 12 for taking an image of the semiconductor pellet 10 is provided on the bonding head 6. The camera 12 is connected to one end of a horizontally installed lens tube 13, and a detector head 14 that receives the image of the semiconductor pellet 10 is provided on the other end of the lens tube 13. Thus, the image of the semiconductor pellet 10 is received by the detector head 14 and transmitted to the camera 12 via the lens tube 13.

A semiconductor pellet 10 is held by vacuum suction on the bonding stages 15A and 15B by suction holes 15a formed in the bonding stages 15A and 15B which are installed side by side.

A positioning claw 16 is provided on the XY table 8. The positioning end 16a of the positioning claw 16 extends below the bonding horn 4 and to the rear portion of the capillary 3. The positioning claw 16 is provided so that the undersurface of the positioning end 16a is slightly above the upper surface of the bonding stage 15. The positioning end 16a is shaped so as to match the shape of the corner of the semiconductor pellet 10 placed on the bonding stages 15A and 15B.

The two bonding stages 15A and 15B are provided next to each other. As shown in FIG. 1, they are each moved in the Y axial direction independently by a stage drive means (not shown) between pellet supply and take-out positions 17A and 17B and bonding positions 18A and 18B.

As seen from FIG. 1, a tray placement table 20 is installed on one side of the bump bonding apparatus 1, and a loader section 21 and an unloader section 22 that are located next to each other are provided on this tray placement table 20. The loader section 21 is provided for trays 23 that accommodate therein semiconductor pellets 10 in a stacked-up fashion, and the unloader section 22 is for trays 23 that accommodate therein semiconductor pellets 10 to which bumps have been applied in a stacked-up fashion.

The front area (which is toward the bottom of the drawing sheet of FIG. 1) of the tray placement table 20, which is where the loader section 21 and unloader section 22 are provided, is provided with a buffer station 24 and a supply and holding station 25 for placing the trays 23 therein. The left side (in FIG. 1) of the buffer station 24 is a rejected parts collecting station 26, and trays 23 that accommodate semiconductor pellets with, for instance, defective bumps are held in this station 26.

The trays 23 on the loader section 21 are supplied to the buffer station 24. More specifically, as shown in FIG. 3, a first horizontal tray support 30 (comprising a pair of supporting elements) that supports both ends of the lower surface of the lowermost tray 23 is provided under the loader section 21. The first horizontal tray support 30 is opened and closed (or its supporting elements are moved towards and away from each other) by a drive means (not shown). A first vertical tray support 31 (comprising a pair of supporting elements) that raises and lowers the trays 23 is provided under the loader section 21 so as to be moved up and down by a drive means (not shown). Furthermore, as seen from FIGS. 5(d) and 5(e), a first pusher 32 that sends a tray 23 on the loader section 21 to the buffer station 24 is provided; and in addition, as seen from FIGS. 5(b) and 5(c), a second pusher 33 that sends a tray 23 on the buffer station 24 to the supply and holding station 25 is also provided.

Once all of the semiconductor pellets 10 to which bumps have been applied are put back in the tray 23 on the supply and holding station 25, the tray 23 is sent to the unloader section 22. The structure for accomplishing this operation comprises, as seen from FIG. 4: a second horizontal tray support 34 (comprising a pair of supporting elements) and a second vertical tray support 35 (comprising a pair of supporting elements). The second horizontal tray support 34 supports both sides of the lower surface of the lowermost tray 23 and is provided under the unloader section 22. The second horizontal tray support 34 is opened and closed (or its supporting elements are moved toward and away from each other) by a drive means (not shown). The second vertical tray support 35 is provided under the unloader section 22 so as to raise and lowers the trays 23 by being moved up and down by a drive means (not shown). In addition, as shown in FIGS. 5(a) and 5(b), a third pusher 36 that sends the tray 23 on the supply and holding station 25 to the unloader section 22 is further provided.

Back to FIG. 1, a bump shaping stage 40 and an inspection stage 41 are provided on one side (on the right-hand side in FIG. 1) of the bonding stages 15A and 1 SB. On the bump shaping stage 40, a bump shaper (not shown) that presses on the upper surface of the bump formed by the bonding apparatus I on the electrode of a semiconductor pellet 10 (10B) is provided so as to be vertically movable. A camera (not shown) for recognizing the shape of the bump on the semiconductor pellet 10 (10A) is installed above the inspection stage 41. In addition, a transfer device 42 is installed on the side of the bump shaping stage 40 so that it transfers the bump-formed semiconductor pellet 10 (10B) on the bump shaping stage 40 onto the inspection stage 41.

A pellet transfer mechanism 50 for transferring the semiconductor pellets 10 under suction is provided in the front side of the apparatus. The pellet transfer mechanism 50 will be described below.

An X axis drive screw (externally threaded screw) 52 is installed on a support frame 51 so that the axial center of the drive screw 52 is in the X axis direction, and both ends of the X axis drive screw 52 are rotatably supported by supports 53 which are fixed to the support frame 51. The output shaft of an X axis drive motor 54 that is fixed to the support frame 51 is coupled to one end (right end in FIG. 1) of the X axis drive screw 52. A guide rail 55 that is installed parallel to the X axis drive screw 52 is mounted on the support frame 51. The X axis drive screw 52 meshes with a threaded block (internally threaded block, not shown), and an X axis table 56 is mounted on top of this threaded block. The X axis table 56 is movable along the guide rail 55.

Figure 6A:
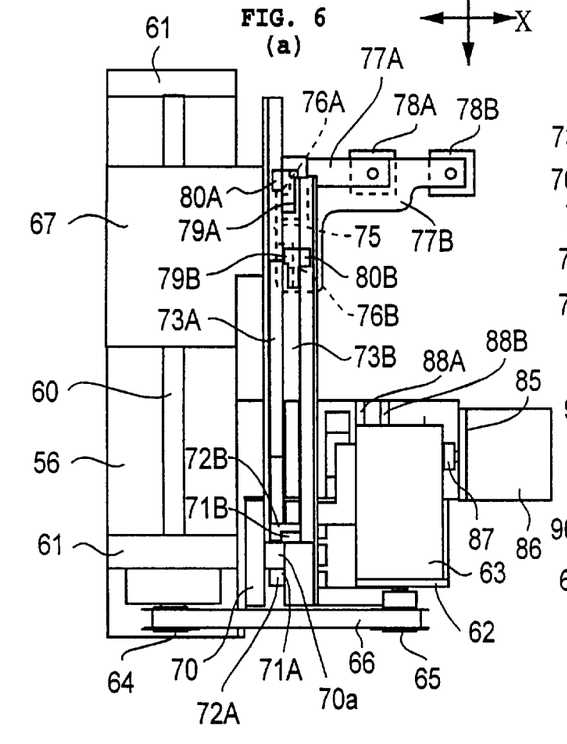
FIG. 6(a) is a top view thereof.
Figure 6B:
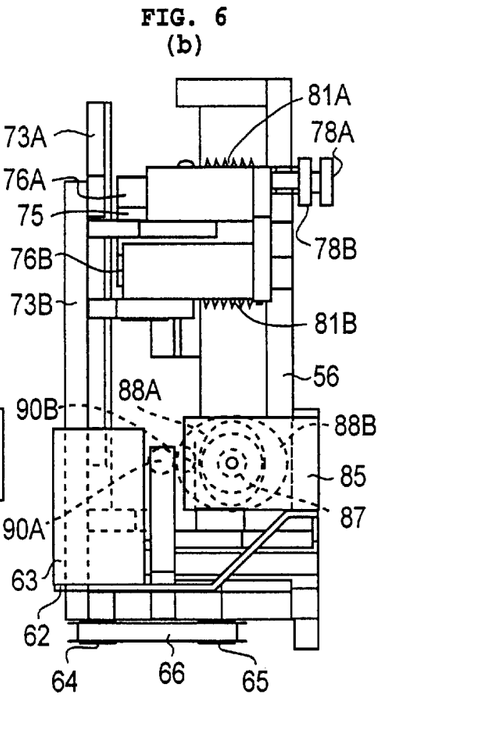
FIG. 6(b) is a side view thereof.
Figure 6C:
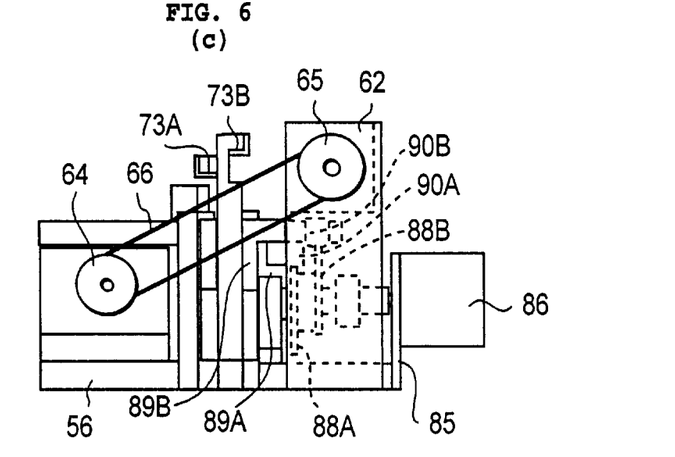
FIG. 6(c) is a front view thereof.

As shown in FIG. 6, a Y axis drive screw 60 is installed on the X axis table 56 so that its axial center is in the Y axis direction, and both ends of the Y axis drive screw 60 are rotatably supported by supports 61 fixed to the X axis table 56. A bracket 62 is fixed to the X axis table 56, and a Y axis drive motor 63 is fixed to this bracket 62. A timing belt 66 is looped around a timing pulley 64 fixed to one end of the Y axis drive screw 60 and a timing pulley 65 fixed to the output shaft of the Y axis drive motor 63. The Y axis drive screw 60 meshes with a threaded block (internally threaded block, not shown), and a Y axis table 67 is fixed to this threaded block.

A vertically installed rail fixing plate 70 is fixed to the side of the X axis table 56, and vertically installed guide rails 71A and 71B are fixed one on either side of the rail fixing component 70a of the rail fixing plate 70. Sliders 72A and 72B are provided on the guide rails 71A and 71 B in a vertically movable fashion; and guide bars 73A and 73B, which are installed parallel with the Y axis drive screw 60, are fixed to the upper ends of the sliders 72A and 72B.

A vertically installed rail fixing plate 75 is fixed to the side of the Y axis table 67, and vertically installed guide rails 76A and 76B are fixed to the rail fixing plate 75. Suction arms 77A and 77B are provided on the guide rails 76A and 76B in a vertically movable fashion, and suction nozzles 78A and 78B are fixed to the distal ends of the suction arms 77A and 77B. Roller support arms 79A and 79B that extend above the guide bars 73A and 73B are fixed to the suction arms 77A and 77B, and rollers 80A and 80B are rotatably supported by the roller support arms 79A and 79B. Springs 81A and 81B are provided to the rail fixing plate 75 and the suction arms 77A and 77B so that the rollers 80A and 80B are pressed against the guide bars 73A and 73B.

Furthermore, a bracket 85 is fixed under the Y axis drive motor 63 of the X axis table 56, and a suction arm vertical drive motor 86 is fixed to the bracket 85. A camshaft 87 provided on the output shaft of the suction arm vertical drive motor 86, and two cams 88A and 88B are fixed to the camshaft 87. Arms 89A and 89B that extend in the direction of the cams 88A and 88B are fixed to the 72A and 72B, and cam followers 90A and 90B are rotatably supported at the ends of the arms 89A and 89B so that they strike the cams 88A and 88B.

The operation of the apparatus described above will be described below. In the tray 23 on the supply and holding station 25 shown in FIG. 1, semiconductor pellets 10E indicated by shading are pellets on which the bump application has been completed. In addition, the semiconductor pellet 10A placed on the inspection stage 41 is the one that is accommodated in the accommodation section 23a of the tray 23, the semiconductor pellet 10B placed on the bump shaping stage 40 is the one that is accommodated in the accommodation section 23b, and the semiconductor pellet 10C placed on the bonding stage 15A is the one that is accommodated in the accommodation section 23c.

The operation of the various mechanisms will be described.

In the bonding apparatus 1, a bump is applied to the semiconductor pellet 10C positioned at the bonding position 18A. Before the bonding stage 15A is moved to the bonding position 18A, a first weak vacuum is turned on in the suction hole 15a of the stage 15A so as to create a suction. The suction force produced in the suction hole 15a by to the first weak vacuum is weak enough to allow the semiconductor pellet 10C to be moved by the positioning claw 16 (discussed below) but not strong enough to damage the semiconductor pellet 10C at this time.

When a bump is applied on the semiconductor pellet 10C, the first step is that the XY table 8 is driven so that the positioning end 16a of the positioning claw 16 (see FIG. 2) comes into contact with a corner of the semiconductor pellet 10C. Once the semiconductor pellet 10C is pushed by the positioning end 16a to a predetermined position, the first weak vacuum is switched over to a second strong vacuum so that the semiconductor pellet 10C is held securely by suction on the bonding stage 15A.

Next, the XY table 8 is driven so as to move the detector head 14 of the lens tube 13 above the semiconductor pellet I OC; then the positioning claw 16 retracts from the bonding stage 15A.

In the above operation, the first weak vacuum is effected in the suction attachment hole 15a before the semiconductor pellet 10C is set on the bonding stage 15. However, the first weak vacuum can be omitted. In other words, it can be designed so that the semiconductor pellet 10C is place on the bonding stage 15 and set on the predetermined position by the positioning craw 16 without using the first weak vacuum. In this operation, the first weak vacuum is off until the pellet is set on the predetermined position, and the second strong vacuum, which is stronger than the first weak vacuum, is effected after the pellet 10C is set on the predetermined position by the positioning craw 16.

After this, just as in the prior art, an image of the electrode on the semiconductor pellet 10C at the predetermined position which is a bonding position is taken by the camera 12 via the detector head 14 and lens tube 13, the ball 2a at the distal end of the wire 2 is bonded to the electrode of the semiconductor pellet 10C at the bonding position, and then the wire 2 is cut off from the ball 2a after this bonding. As a result, a bump is formed on the electrode of the semiconductor pellet 10C.

Returning to FIG. 1, a bump shaping is performed at the bump shaping stage 40 so as to smooth out the upper surface of the bump of the semiconductor pellet 10B. In the application of a bump by the bonding apparatus 1 and the shaping of the bump at the bump shaping stage 40, a shaper (not shown) comes down and presses on the bump, flattening its upper surface.

Next, the transfer of the semiconductor pellets from the bump shaping stage 40 to the inspection stage 41 is performed by the transfer device 42.

The transfer of a semiconductor pellet to the various other mechanisms is performed by the pellet transfer mechanism 50. In this case, the transfer of a semiconductor pellet 10 from the tray 23 located at the supply and holding station 25 to the bonding stages 15A and 15B and the transfer of the semiconductor pellet 10 from the bonding stages 15A and 15B to the bump shaping stage 40 are performed by the suction nozzle 78A.

More specifically, once it has been determined at the inspection stage 41 that the shape of the bump formed on the semiconductor pellet 10 (10A) is good, the semiconductor pellet 10 (10A) is put, by the suction nozzle 78B, into its original accommodation section 23a of the tray 23 in which the semiconductor pellet 10 (10A) was accommodated. If it is determined that the semiconductor pellet 10 (10A) has, for instance, a defective bump, then this semiconductor pellet 10 (10A) is put into the tray 23 in the rejected parts collecting station 26.

The suction nozzles 78A and 78B are used differently.

The suction nozzle 78A, which has a trapezoidal suction component, is used for transferring the semiconductor pellet 10 from the tray 23 of the supply and holding station 25 to the bonding stages 15A and 15B, avoiding damage on the electrodes formed on the upper surface of the semiconductor pellet 10. The suction nozzle 78A is also used for transferring the semiconductor pellet 10 from the bonding stages 15A and 15B to the bump shaping stage 40 because the level of the upper surface of the bumps is not consistent.

On the other hand, the suction nozzle 78B, which has a suction component that reliably maintains suction, is used for transferring the semiconductor pellets 10 from the inspection stage 41 to the tray 23 of the supply and holding station 25, because the upper surface of bumps is flat and its level is consistent.

Naturally, the suction arm 77B and the suction nozzle 78B may be eliminated; and in this case, the semiconductor pellet 10 is transferred from the inspection stage 41 to the tray 23 in the supply and holding station 25 by the suction nozzle 78A.

The basic operation of the pellet transfer mechanism 50 will now be described with reference to FIGS. 1 and 6.

When the X axis drive motor 54 rotates, it rotates the X axis drive screw 52 and moves the X axis table 56 along the guide rail 55 in the X axial direction via the threaded block (not shown) and also moves the Y axis table 67 along with the X axis table 56 in the X axial direction.

When the Y axis drive motor 63 rotates, it rotates the Y axis drive screw 60 via the timing pulley 65, the timing belt 66, and the timing pulley 64, and moves the Y axis table 67 in the Y axial direction. More specifically, the Y axis table 67 can be moved to any position in the X and Y axial directions by the rotation of the X axis drive motor 54 and the Y axis drive motor 63.

The suction arms 77A and 77B can be moved in the Y axial direction along with the Y axis table 67 and also moved up and down with respect to the Y axis table 67. The rollers 80A and 80B provided on the roller support arms 79A and 79B integrated with the suction arms 77A and 77B are pressed by the springs 81A and 81B against the top of the guide bars 73A and 73B. Thus, when the Y axis table 67 is moved in the Y axial direction, the rollers 80A and 80B are moved along the guide bars 73A and 73B. In other words, when the Y axis table 67 are moved to any position in the X and Y axial directions, the suction nozzles 78A and 78B are also moved along with the Y axis table 67.

When the suction arm vertical drive motor 86 rotates, it rotates the camshaft 87 and the cams 88A and 88B. The relationship between the cams 88A and 88B is as follows: When the suction arm vertical drive motor 86 rotates forward from a reference position of the rotational start and the camshaft 87 and the cams 88A and 88B are rotated forward by 180° from the reference position, only the cam 88A is in a descending profile; and when the suction arm vertical drive motor 86 rotates backward from the reference position and these components are rotated backward by 180°, only the cam 88B is in a descending profile.

Therefore, when the suction arm vertical drive motor 86 rotates forward from the reference position and the cams 88A and 88B are thereby rotated forward from the reference position, the descending profile of the cam 88A causes the slider 72A to descend along the guide rail 71A via the cam follower 90A and the arm 89A. As a result, the guide bar 73A fixed to the slider 72A descends, and the roller 80A descends along with the guide bar 73A under the biasing force of the spring 81A. When the roller 80A descends, the suction arm 77A descends along the guide rail 76A via the roller support arm 79A, and the suction nozzle 78A also descends. When the suction arm vertical drive motor 86 rotates backward from the position to which the suction arm 77A has descended, the suction arm 77A and the suction nozzle 78A are raised by the steps opposite of that described above.

To the contrary, when the suction arm vertical drive motor 86 rotates backward from the reference position and causes the cams 88A and 88B to rotate backward from the reference position, the descending profile of the cam 88B causes the slider 72B to descend along the guide rail 71B via the cam follower 90B and the arm 89B. As a result, the guide bar 73B fixed to the slider 72B descends, and the roller 80B descends along with the guide bar 73B under the biasing force of the spring 81B. When the roller 80B descends, the suction arm 77B descends along the guide rail 76B via the roller support arm 79B, and the suction nozzle 78B descends. When the suction arm vertical drive motor 86 rotates forward from the position to which the suction arm 77B has descended, the suction arm 77B and the suction nozzle 78B are raised by the steps opposite of that described above.

The semiconductor pellet 10 is transferred to the various mechanisms by the suction nozzles 78A and 78B in the following manner:

The above-described action of the pellet transfer mechanism 50 causes the semiconductor pellet 10A that has been inspected at the inspection stage 41 to be put back in its original accommodation section 23a of the tray 23, or to be put in the tray 23 in the rejected parts collecting station 26. In this operation, the X axis drive motor 54 and the Y axis drive motor 63 rotate so as to position the suction nozzle 78B above the inspection stage 41 as in the operation described above; the suction arm vertical drive motor 86 rotates backward from the reference position, causing the suction nozzle 78B to descend as in the operation described above; and when the suction nozzle 78B hits the semiconductor pellet 10A, the vacuum is turned on for the suction nozzle 78B, and the semiconductor pellet 10A is held by suction to the suction nozzle 78B; and the suction arm vertical drive motor 86 rotates forward so as to raise the suction nozzle 78B as in the operation described above.

If the semiconductor pellet 10A is not defective (and passes the inspection), the X axis drive motor 54 and the Y axis drive motor 63 rotate so that the suction nozzle 78B is positioned above the original accommodation section 23a. If, however, the semiconductor pellet 10A is defective (and fails the inspection), then the X axis drive motor 54 and the Y axis drive motor 63 rotate so that the suction nozzle 78B is positioned above the accommodation section of the tray 23 in the rejected parts collecting station 26.

The suction arm vertical drive motor 86 then rotates backward from the reference position so as to descend the suction nozzle 78B; and when the semiconductor pellet 10A held by suction to the suction nozzle 78B is positioned slightly above the accommodation section 23a or the accommodation section of the tray 23 of the rejected parts collecting station 26, the vacuum is turned off for the suction nozzle 78B, so that the semiconductor pellet 10A is placed in the accommodation section 23a or into the accommodation section of the tray 23 in the rejected parts collecting station 26. After this, the suction arm vertical drive motor 86 rotates forward, raising the suction nozzle 78B.

In FIG. 1, the bonding stage 15B is in the pellet supply and take-out position 17(B), and no semiconductor pellet 10 is placed on the bonding stage 15B; as a result, the pellet transfer mechanism 50 transfers the semiconductor pellet 10D onto this bonding stage 15B. More specifically, the X axis drive motor 54 and the Y axis drive motor 63 rotate so as to move the suction nozzle 78A above the semiconductor pellet 10D, then the suction arm vertical drive motor 86 rotates forward from the reference position so as to descend the suction nozzle 78A until it hits the semiconductor pellet 10D, whereupon the vacuum is turned on for the suction nozzle 78A. As a result, the semiconductor pellet 10D is held by suction to the suction nozzle 78A.

Then, the suction arm vertical drive motor 86 rotates backward from the reference position so as to raise the suction nozzle 78A, and the X axis drive motor 54 and the Y axis drive motor 63 rotate so as to move the suction nozzle 78A above the bonding stage 15B. The suction arm vertical drive motor 86 then rotates forward from the reference position so as to descend the suction nozzle 78A; and when the semiconductor pellet 10D that is held by suction to the suction nozzle 78A is positioned slightly above the bonding stage 15B, the vacuum is turned off for the suction nozzle 78A, so that the semiconductor pellet 10D is placed on the bonding stage 15B. The suction arm vertical drive motor 86 then rotates backward, raising the suction nozzle 78A.

Once the semiconductor pellet 10D is placed on the bonding stage 15B, the bonding stage 15B is moved to the bonding position 18B. When the application of the bump to the semiconductor pellet 10C on the bonding stage 15A is completed by the bonding apparatus 1, the bonding stage 15A is moved to the pellet supply and take-out position 17A. The semiconductor pellet 10A on the inspection stage 41 has been transferred to the accommodation section 23a, and the semiconductor pellet 10B on the bump shaping stage 40 has been transferred to the inspection stage 41. Accordingly, when the application of the bump to the semiconductor pellet 10C on the bonding stage 15A is completed and the bonding stage 15A is moved to the pellet supply and take-out position 17A, the semiconductor pellet 10C is transferred to the bump shaping stage 40 by the suction nozzle 78A.

This transfer of the semiconductor pellet 10C to the bump shaping stage 40 by the suction nozzle 78A is made by the same operation as described above. In other words, the X axis drive motor 54 and the Y axis drive motor 63 rotate so as to move the suction nozzle 78A above the semiconductor pellet 10C that is positioned at the pellet supply and take-out position 17A; the suction arm vertical drive motor 86 rotates forward from the reference position so as to descend the suction nozzle 78A until it hits the semiconductor pellet 10C, whereupon the vacuum is turned on for the suction nozzle 78A; and the semiconductor pellet 10C is held by suction to the suction nozzle 78A.

Then, the suction arm vertical drive motor 86 rotates backward so as to raise the suction nozzle 78A, and the X axis drive motor 54 and the Y axis drive motor 63 rotate so as to move the suction nozzle 78A above the bump shaping stage 40. The suction arm vertical drive motor 86 then rotates forward from the reference position so as to descend the suction nozzle 78A, and when the semiconductor pellet 10C that is held by suction to the suction nozzle 78A is positioned slightly above the bump shaping stage 40, the vacuum is turned off for the suction nozzle 78A; as a result, the semiconductor pellet 10C is placed on the bump shaping stage 40. The suction arm vertical drive motor 86 then rotates backward so as to raise the suction nozzle 78A.

Once bumps have been applied to all of the semiconductor pellets 10 and these pellets have been returned to the tray 23 positioned in the supply and holding station 25, the tray 23 in the supply and holding station 25 is sent to the unloader section 22; and the tray 23 at the buffer station 24 is sent to the supply and holding station 25. After this, the tray 23 in the loader section 21 is sent to the buffer station 24.

These operations are described with reference to FIGS. 3 to 5.

First, the operation in which the tray 23 in the supply and holding station 25 is sent to the unloader section 22 will be described through reference to FIGS. 4(a) through 4(f) and FIGS. 5(a) through 5(f).

Figure 4A:
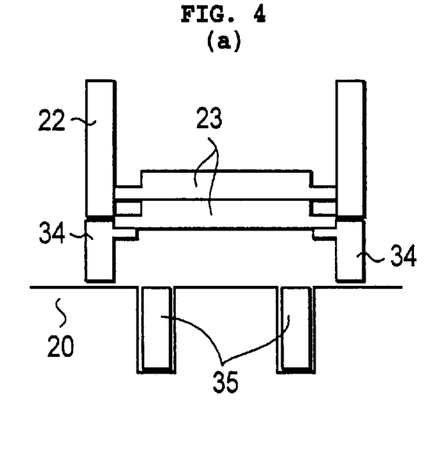
FIGS. 4(a) to 4(f) show the steps in which trays are put in the unloader section.
Figure 4B:
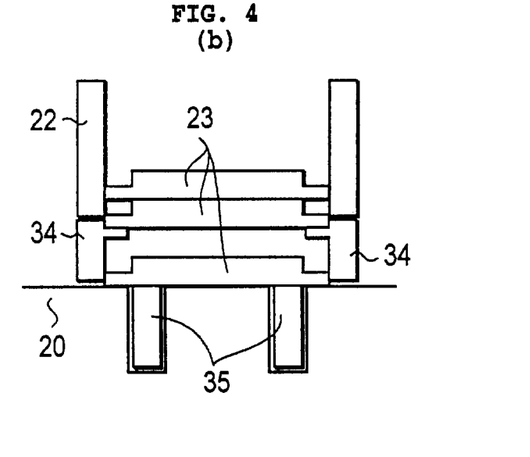
Figure 4C:
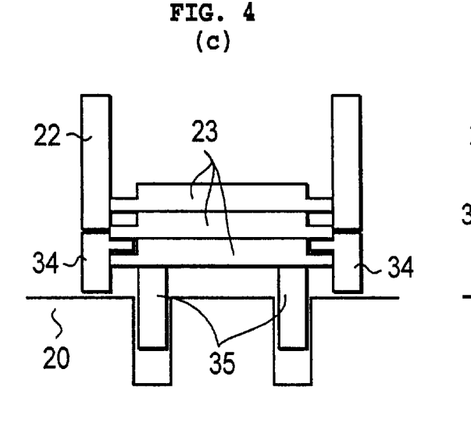
Figure 4D:
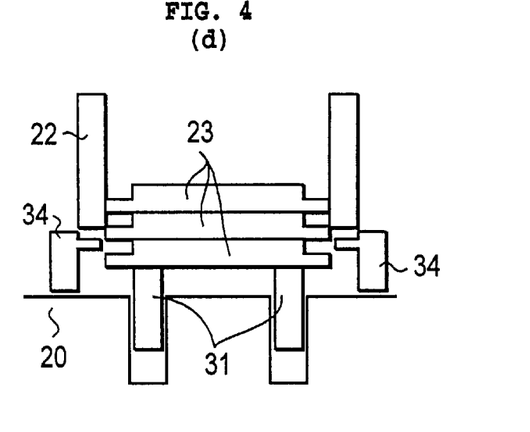
Figure 4E:
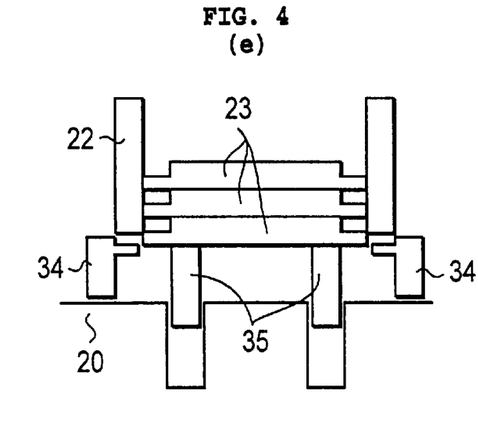
Figure 4F:
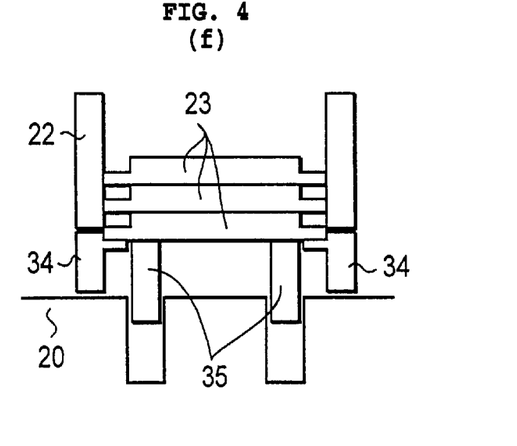
Figure 5A:
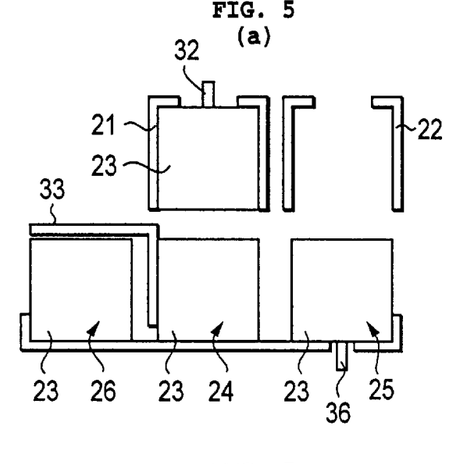
FIGS. 5(a) and 5(b) show the operation in which trays are sent from the supply and holding station to the unloader section.
Figure 5B:
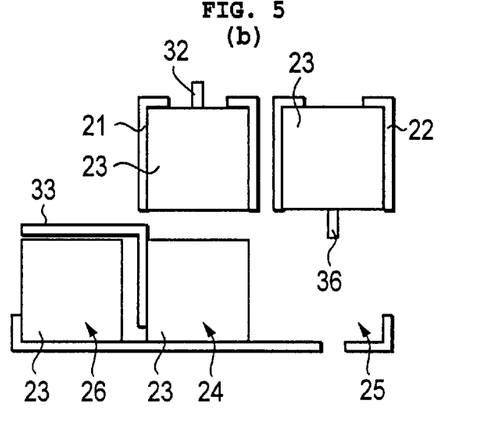

From the state depicted in FIGS. 4(a) and 5(a), the third pusher 36 is operated as shown in FIG. 5(b) and pushes the tray 23 in the supply and holding station 25 to under the unloader section 22 as shown in FIG. 4(b). Then, the second vertical tray support 35 is raised as shown in FIG. 4(c). Next, the second horizontal tray support 34 retracts (or its supporting elements are moved away from each other) as shown in FIG. 4(d). The second vertical tray support 35 is then raised so as to position the lower surface of the lowermost tray 23 higher than the second horizontal tray support 34 as shown in FIG. 4(e). After this, the second horizontal tray support 34 advances (or its supporting elements are moved toward each other) as shown in FIG. 4(f), thus supporting the lowermost tray 23 thereon. After this, the second vertical tray support 35 descends as shown in FIG. 4(a), and the tray 23 at the supply and holding station 25 is put on the unloader section 22.

Figure 5C:
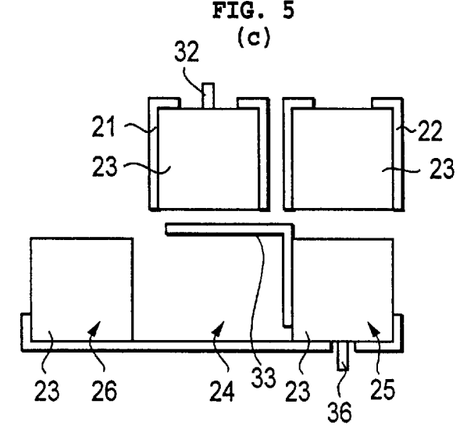
FIG. 5(c) shows the operation in which trays are sent from the buffer station to the supply and holding station.
Figure 5D:
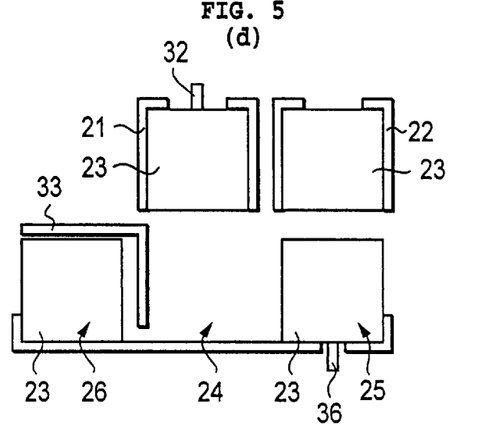
FIGS. 5(d) and 5(e) show the operation in which trays are sent from the loader section to the buffer station.

Once the supply and holding station 25 becomes empty, and the third pusher 36 is returned to its original position as shown in FIG. 5(b), the second pusher 33 is operated as shown in FIG. 5(c) to push the tray 23 in the buffer station 24 to the supply and holding station 25. After this, the second pusher 33 is returned to its original position as shown in FIG. 5(d). Once the buffer station 24 becomes empty, the tray 23 is then sent from the loader section 21 to the buffer station 24.

The operation in which the tray 23 is sent from the loader section 21 to the buffer station 24 is described through reference to FIGS. 3(a) to 3(f) and FIGS. 5(d) and 5(e).

Figure 3A:
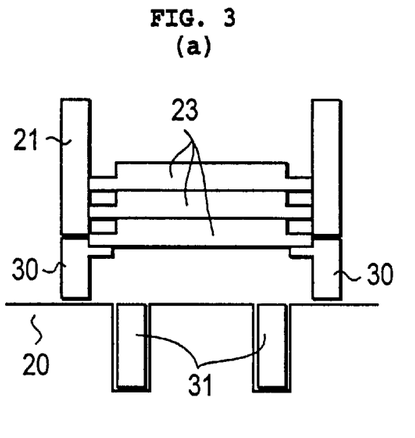
FIGS. 3(a) to 3(f) show the operation steps in which trays are taken out of the loader section.
Figure 3B:
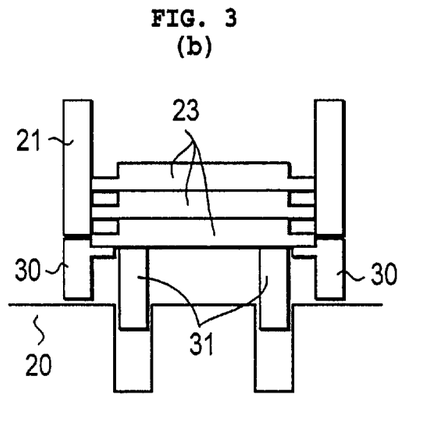
Figure 3C:
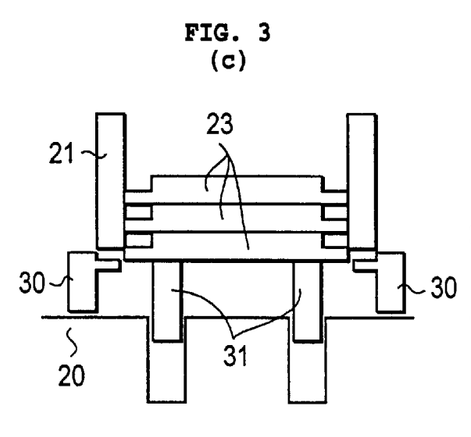
Figure 3D:
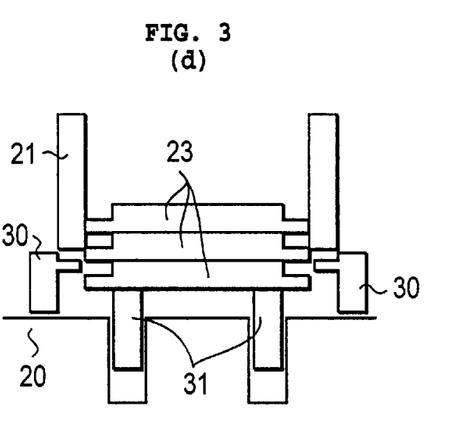
Figure 3E:
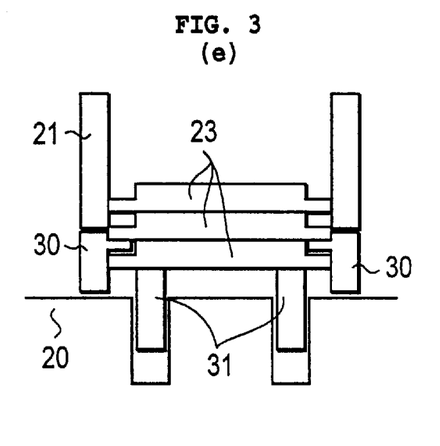
Figure 3F:
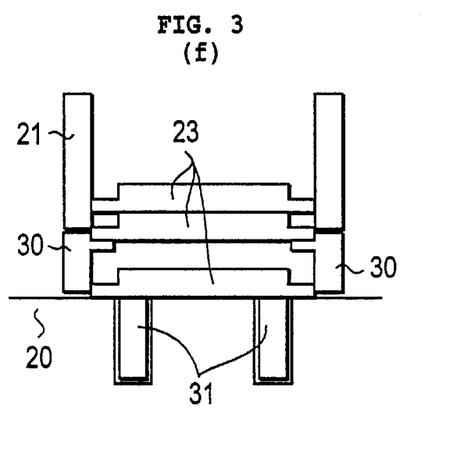
Figure 5E:
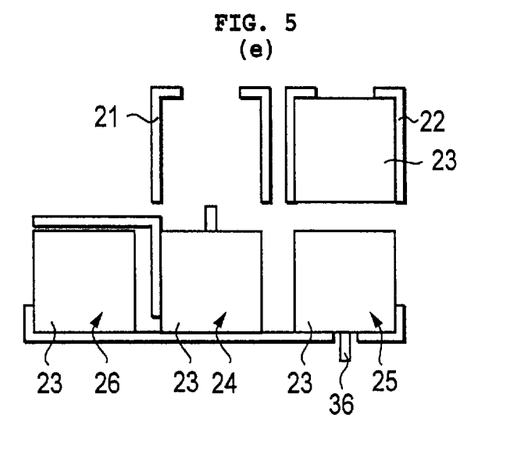

From the state depicted in FIGS. 3(a) and 5(d), the first horizontal tray support 31 is raised and lifts the trays 23 slightly off the first horizontal tray support 30 as shown in FIG. 3(b). The first horizontal tray support 30 then retracts (or its supporting elements are moved away from each other) as shown in FIG. 3(c). The first vertical tray support 31 then descends by a distance equal to the thickness of the trays 23 as shown in FIG. 3(d). As a result, the lower surface of the second tray 23 from the bottom is positioned slightly higher than the first horizontal tray support 30. The first horizontal tray support 30 then advances (or its supporting elements are moved toward each other) until positioned under the second tray 23 from the bottom as shown in FIG. 3(e). After this, the first vertical tray support 31 descends and only the lowermost tray 23 is placed on the tray placement table 20 as shown in FIG. 3(f). The first pusher 32 shown in FIG. 5(d) then advances as shown in FIG. 5(e) and sends the trays 23 from the loader section 21 to the buffer station 24. As a result, the trays 23 on the loader section 21 are put in the buffer station 24.

As seen from the above, the loader section 21 and the unloader section 22 are provided next each other on one side of the bonding stages 15A and 15B, and the buffer station 24 and supply and holding station 25 are provided so as to positionally correspond to (or so as to face) the loader section 21 and unloader section 22, respectively. Accordingly, it is possible to avoid the bonding apparatus to become large in size even though the bump shaping stage 40 and inspection stage 41, for instance, are provided on the other side of the bonding stages 15A and 15B as in this embodiment.

Also, with the two bonding stages 15A and 15B provided next each other so that they are each moved independently to the pellet supply and take-out positions 17A and 17B and to the bonding positions 18A and 18B, a bump can be applied at one of the bonding stages 15A and 15B while the semiconductor pellet 10 is supplied to or taken off from the other one of the bonding stages 15A and 15B. Thus, it is possible to enhance the working efficiency of the bonding apparatus 1.

Also, in the present invention, the two suction nozzles 78A and 78B are provided on the pellet transfer mechanism 50, the suction component of one of the suction nozzles 78A is formed in a trapezoidal shape, and that of the other suction nozzle 78B is formed in a flat shape. Accordingly, the suction nozzle 78A or 78B that is best suited to the process can be selected to be used when the semiconductor pellet 10 is to be picked up from the processes of the various mechanisms. Naturally, the suction nozzles 78A and 78B may be either trapezoidal or flat.

Also, with the positioning claw 16 provided on the XY table 8 of the bonding apparatus 1, a positioning stage becomes unnecessary, and the apparatus can be simplified. In this case, the positioning claw 16 need not be provided to just the XY table 8, and it may instead be provided on the bonding head 6 or on any member fixed to the bonding head 6.

As seen from the above, in the bump bonding apparatus according to the present invention, a loader section that holds trays which accommodate therein semiconductor pellets and an unloader section that holds trays which accommodate therein semiconductor pellets to which bumps have been applied are provided next to each other on one side of the bonding stage; a buffer station and a supply and holding station are provided so as to positionally correspond to the loader section and the unloader section, respectively; and in addition, a pushing means for sending a tray from the loader section to the buffer station, a pushing means for sending a tray from the supply and holding station to the unloader section, a pushing means for sending a tray from the buffer station to the supply and holding station, and also a pellet transfer mechanism for picking up the semiconductor pellets in the tray in the supply and holding station, transferring them to the bonding stage, and returning the semiconductor pellets to which bumps have been applied to an accommodation section of the trays that accommodate the semiconductor pellets, are provided. Accordingly, it is possible to make the bonding apparatus compact.

What is claimed is:

1. A bump bonding apparatus for applying bumps to a semiconductor pellet, wherein the bump bonding apparatus comprises:

a bump bonding stage for bonding bumps to electrodes of a semiconductor pellet;

a loader section that holds a tray which accommodates therein a semiconductor pellet, and an unloader section that holds a tray which accommodates therein a semiconductor pellet to which bumps have been applied, said loader section and loader section being provided next to each other on one side of said bump bonding stage;

a buffer station and a supply and holding station provided so as to correspond to said loader section and unloader section, respectively;

a means for sending a tray from said loader section to said buffer station;

a means for sending a tray from said supply and holding station to said unloader section;

a means for sending a tray from said buffer station to said supply and holding station; and a pellet transfer mechanism for picking up said semiconductor pellet accommodated in said tray on said supply and holding station, transfer said semiconductor pellet to said bump bonding stage, and then returning said semiconductor pellet to which bumps have been applied to said tray that has accommodated said semiconductor pellet.

2. A bump bonding apparatus according to claim 1, wherein said bump bonding stage is provided in a plural number next to each other, and each of said bonding stages is moved independently to a pellet supply and take-out position and to a bonding position.

3. A bump bonding apparatus according to claim 1, wherein said pellet transfer mechanism is provided with two suction nozzles which are selectively movable in a vertical direction, a suction component of one of said suction nozzles being in a trapezoidal shape, and a suction component of another of said suction nozzles being flat.

4. A bump bonding apparatus according to claim 1, further comprising a bump shaping stage and an inspection stage both provided on one side of said bonding stage, said bump shaping stage for shaping bumps applied on said semiconductor pellet, and said inspection stage for inspecting said semiconductor pellet that has been shaped on said bump shaping stage.

5. A bump bonding apparatus according to in claim 4, wherein said bump shaping stage and said inspection stage are provided on an opposite side from where said loader section and unloader section are provided.

6. A bump bonding apparatus according to in claim 1, further comprising a positioning claw for positioning said semiconductor pellet placed on said bump bonding stage, said positioning claw being provided on a bonding head or on an XY table on which said bonding head is provided.

* * * * *